United States Patent [19]

Golin

[11] Patent Number: 5,793,896
[45] Date of Patent: Aug. 11, 1998

[54] ORDERING CORRECTOR FOR VARIABLE LENGTH CODES

[75] Inventor: Stuart J. Golin, East Windsor, N.J.

[73] Assignee: Intel Corporation, Santa Ana, Calif.

[21] Appl. No.: 409,514

[22] Filed: Mar. 23, 1995

[51] Int. Cl.⁶ .............................. G06K 9/36; G06K 9/46; H03M 7/40
[52] U.S. Cl. .............. 382/246; 382/239; 341/67; 341/107
[58] Field of Search ....................... 382/246, 244, 382/239, 232; 358/427, 261.1–261.3, 430; 341/65, 67, 95, 106, 107, 51; 364/715.02, 725; 348/419, 390, 420; 375/246, 253

[56] References Cited

U.S. PATENT DOCUMENTS

| | | | |
|---|---|---|---|
| 3,883,847 | 5/1975 | Frank | 340/146.1 |
| 4,369,463 | 1/1983 | Anastassiou | 358/135 |
| 4,386,416 | 5/1983 | Giltner | 364/900 |
| 4,396,906 | 8/1983 | Weaver | 340/347 |
| 4,516,246 | 5/1985 | Kenemuth | 341/67 |
| 4,563,671 | 1/1986 | Lim et al. | 340/347 |
| 4,574,382 | 3/1986 | Ko | 340/347 |
| 4,580,162 | 4/1986 | Mori | 358/135 |
| 4,593,267 | 6/1986 | Kuroda et al. | 340/347 |
| 4,598,419 | 7/1986 | Mignot et al. | 382/228 |
| 4,700,175 | 10/1987 | Bledsoe | 340/347 |
| 4,706,265 | 11/1987 | Furukawa | 375/122 |
| 4,813,056 | 3/1989 | Pedele | 341/107 |
| 4,839,724 | 6/1989 | Keesen et al. | 348/418 |
| 4,899,149 | 2/1990 | Kahan | 341/67 |
| 4,967,196 | 10/1990 | Sprague et al. | 341/67 |
| 5,045,853 | 9/1991 | Astle et al. | 341/67 |
| 5,057,917 | 10/1991 | Shalkauser et al. | 358/135 |
| 5,220,325 | 6/1993 | Acklund et al. | 341/67 |
| 5,268,769 | 12/1993 | Tsuchiya et al. | 341/67 |
| 5,304,995 | 4/1994 | Dachiku | 341/67 |
| 5,329,313 | 7/1994 | Keith | 348/422 |
| 5,481,364 | 1/1996 | Ito | 382/246 |
| 5,506,580 | 4/1996 | Whiting et al. | 341/67 |
| 5,528,628 | 6/1996 | Park et al. | 375/240 |
| 5,532,694 | 7/1996 | Mayers et al. | 341/67 |
| 5,546,080 | 8/1996 | Langdon, Jr. et al. | 341/107 |

FOREIGN PATENT DOCUMENTS

| | | |
|---|---|---|
| 0145396 | 6/1985 | European Pat. Off. . |
| WO8905556 | 6/1989 | WIPO . |

OTHER PUBLICATIONS

Gonzalez et al. Digital Image processing. 1992. pp. 343–349.

Lee et al. Dynamic Mapping Technique for Adaptive Huffman Code. IEEE TENCON'93/Beijing. pp. 653–656.

Papoulis. Probability. Random Variables and Stochastic Processes. McGraw–Hill. 3rd Edition. pp. 3–14 and 241–247.

"DVI Image Compression—Second Generation." by Stuart J. Golin. Image Processing Algorithms and Techniques III. SPIE vol. 1657. Proceedings of the International Society for Optical Engineering. 1992. pp. 106–113.

Abramson. N., Information Theory and Coding. McGraw–Hill 1963. pp. 77–92.

"The i750 Video Processor: A Total Multimedia Solution." Communications of the ACM, vol. 34. No. 4. Apr. 1991. New York. pp. 64–78.

Patent Abstracts of Japan. vol. 11, No. 83, (B–489) (2530). Mar. 13, 1987, entitled "Data Processing Method" and JP.A61237520 (Canon, Inc.) 22 Oct. 1986.

*Primary Examiner*—Leo Boubreau
*Assistant Examiner*—Bhavesh Mehta
*Attorney, Agent, or Firm*—William H. Murray; N. Stephen Kinsella

[57] ABSTRACT

A computer-implemented method for encoding symbols of a current message with a variable-length code. According to a preferred embodiment, the statistics of the current message, are analyzed, wherein the symbols of the current message constitute a symbol set. Dominant symbols of the symbol set which are out of order are determined. Selected symbols of the dominant symbols are reordered in the variable-length code to reduce the size of code words of the variable-length code which represent the selected symbols.

26 Claims, 5 Drawing Sheets

ORDERING CORRECTOR FOR VARIABLE LENGTH CODES

BACKGROUND OF THE INVENTION

1. Field of the Invention

The present invention relates to signal processing and, in particular, to computer-implemented processes and apparatuses for signal processing with variable-length codes.

2. Description of the Related Art

This invention relates to signal processing which is often utilized to compress symbols into an encoded bitstream of code words. Symbols encoded can correspond to letters or other characters, numbers, signal intensity or amplitude values, quantized discrete cosine transform (DCT) coefficients representative of an image, or motion vectors used in image processing, inter alia. A string of symbols to be encoded is sometimes referred to as a message, and a message is formed of different combinations of symbols of a finite symbol set.

The portion of an encoded bitstream representing compressed, i.e. encoded, data may be stored in a mass storage device in its compressed format in order to conserve storage space. When the compressed data is later retrieved it may be decompressed, i.e. decoded, and, for example, displayed on a monitor, printed on a printer device, or further processed. The symbols of a message may also be encoded in real-time and transmitted to a decoder system which decodes the code words representing the encoded symbols of the message in real time.

For a given message comprised of such symbols, there is a statistical probability distribution among the symbols of the symbol set. A symbol set from which up to n possible symbols are drawn may be denoted by S, where $S=\{S_0, S_1, \ldots S_{n-1}\}$, and where $S_i$ represents the symbol having the probability $p_i$. It will be appreciated that the sum $p_0+p_1+\ldots+p_{n-1}=1$. In this usage, it is assumed that these probabilities are initially ordered in monotonically decreasing fashion so that, for example, $S_0$ is the most probable symbol of S, and $S_{n-1}$ is the least probable symbol of S, with respect to the symbol probability distribution within a given message. Thus, for a given message, a set is ordered in monotonically decreasing fashion if $p_i \geq p_{i+1}$ for all i, where $0 \leq i \leq n-2$. It is also assumed in such usages that the occurrences of these symbols are uncorrelated, i.e. they come from a memoryless source.

One major method of encoding (and decoding) these symbols is variable-length coding (VLC). In VLC, the encodings of the symbols are referred to as code words, and the association of symbols and code words is referred to as the code. In VLC techniques, code words of varying bit lengths are transmitted or stored for each symbol rather than the symbol itself, with more common or probable symbols being represented by code words with a relatively small number of bits, and less probable symbols represented by code words with a relatively large number of bits. Because more common symbols need to be encoded more often than less probable symbols, efficiency in terms of encoded bits can be achieved, if the code is constructed to accurately account for the statistics of the symbol set of the message(s) being encoded. Such encoding techniques are described in William B. Pennebaker & Joan L. Mitchell, *JPEG: Still Image Data Compression Standard* (New York: Van Nostrand Reinhold, 1993), chapters 8 and 11 of which are incorporated herein by reference.

Huffman encoding is a popular VLC technique. In Huffman encoding, an encoder constructs the code, called a Huffman tree, from the statistics of the symbol set. This Huffman tree is made available to both the encoder and decoder systems. If the tree is transmitted by the encoder to the decoder, the code transmission constitutes overhead. The code is typically stored, in both encoders and decoders, in code tables.

VLC encoding techniques such as Huffman encoding techniques are usually, in practice, based on the statistics of "training" symbol sets rather than on those of the current message, and thus are not optimal for all current messages being encoded. One reason for using suboptimal codes such as Huffman trees for some messages is that the overhead for transmitting a new code can be prohibitively large for small messages. Another reason is that rapid decoding may be necessary, which may require the decoder to use decoder tables that cannot be constructed in real time. Similarly, preparing and transmitting a code for each message may place undesirable processing burdens on the encoder. Thus, even though a current message has different statistics than those built into the encoder and decoder VLC tables, the message is often encoded and decoded using a suboptimal code because transmission of an optimal code for each message is not always feasible.

Furthermore, code tables are often hard coded in read-only memory (ROM) tables, rather than transmitted from the encoder to the decoder. In this case, it is not practicable to create a new code table to mirror the statistics of whatever current message is being encoded, and the suboptimal code table must be used to encode and decode symbols of the current message. This can result in less efficient encoding than is ideally attainable with VLC techniques.

There is thus a need for methods and apparatuses for processing signals that more efficiently encode symbols of a current message using variable-length coding techniques.

SUMMARY

There is provided herein a computer-implemented method for encoding symbols of a current message with a variable-length code. According to a preferred embodiment of the invention, the statistics of the current message, are analyzed, wherein the symbols of the current message constitute a symbol set. Dominant symbols of the symbol set which are out of order are determined. Selected symbols of the dominant symbols are reordered in the variable-length code to reduce the size of code words of the variable-length code which represent the selected symbols.

BRIEF DESCRIPTION OF THE DRAWINGS

These and other features, aspects, and advantages of the present invention will become more fully apparent from the following description, appended claims, and accompanying drawings in which:

DESCRIPTION OF THE PREFERRED EMBODIMENT

In the present invention, there is disclosed a method and apparatus for encoding and decoding symbols utilizing VLC techniques. In a preferred embodiment, as described in further detail hereinbelow, the order of code words in code tables is changed so that more dominant symbols of the current symbol set are associated with relatively smaller code words.

Video Processing System Hardware

Figure 1:
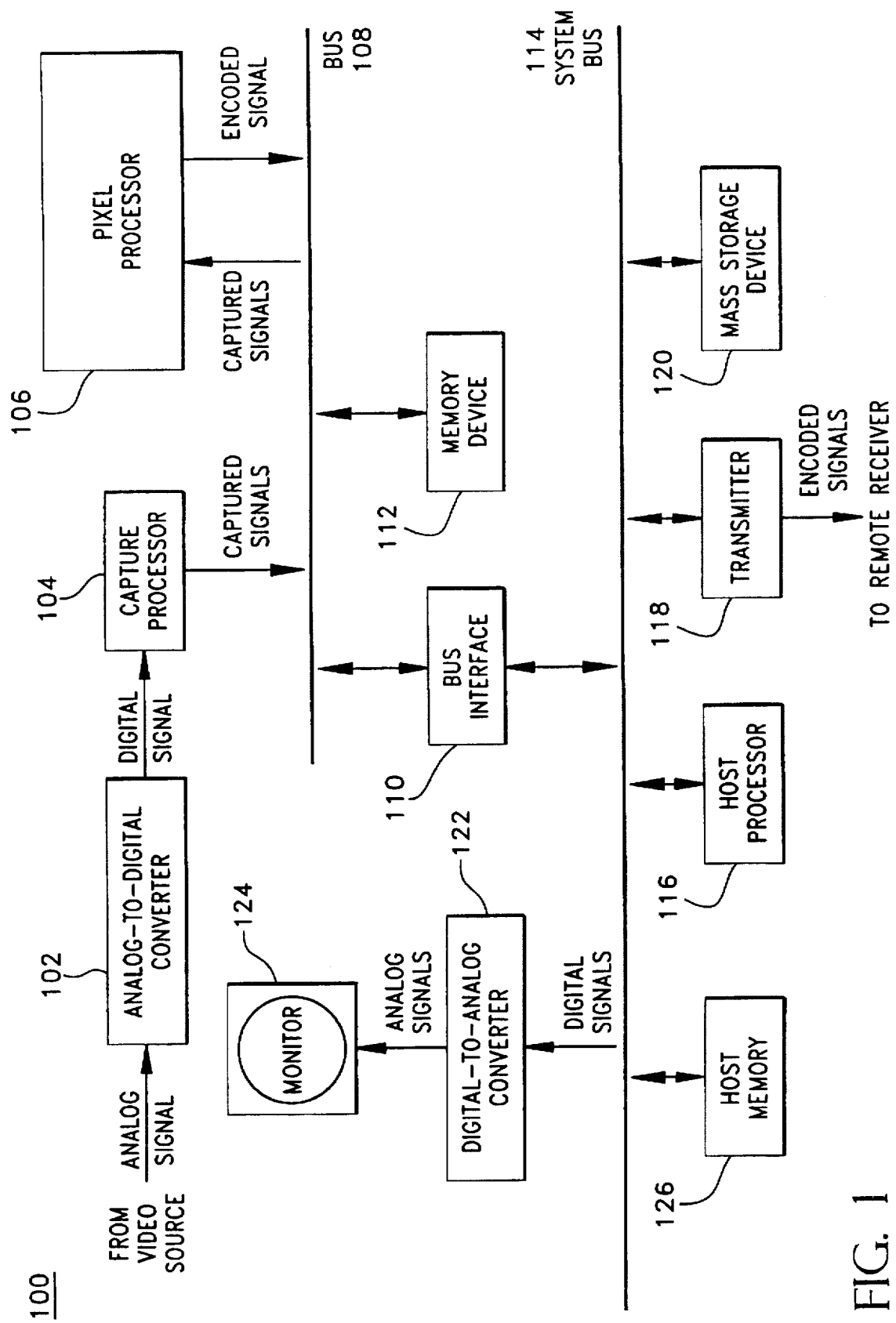
FIG. 1 is a computer-based encoding system for encoding video signals, according to a preferred embodiment of the present invention.

Referring now to FIG. 1, there is shown a computer-based signal encoding system 100 for encoding signals representative of data, according to a preferred embodiment of the present invention. Encoding system 100 may be utilized to encode data signals comprising various types of symbol sets, such as video data. Encoding system 100 is described herein with reference to the encoding of data representative of video images, e.g. representative of the coefficients of a discrete cosine transform (DCT), or of motion vectors calculated using in motion estimation techniques. In general, such symbols represent data that may already be transformed by other techniques, and that are to be encoded via Huffman encoding before transmission or storage. Such symbols constitute a symbol set S and are typically associated with a probability distribution. Those skilled in the art will appreciate that encoding systems may also be utilized to encode symbols representative of non-video forms of data as well, such as audio or textual data.

Analog-to-digital (A/D) converter 102 of encoding system 100 receives analog video image signals from a video source. The video source may be any suitable source of analog video image signals such as a video camera or VCR for generating local analog video image signals or a video cable or antenna for receiving analog video image signals from a remote source. A/D converter 102 decodes (i.e., separates the signal into constituent components) and digitizes each frame of the analog video image signals into digital image component signals (e.g., in a preferred embodiment, Y, U, and V component signals).

Capture processor 104 receives, captures, and stores the digitized component signals as subsampled video images in memory device 112 via bus 108. Each subsampled video image is represented by a set of two-dimensional component planes or pixel bitmaps, one for each component of the digitized video image signals. In a preferred embodiment, capture processor 104 captures video image signals in a YUV9 or YUV4:1:1 format, in which every (4×4) block of pixels of the Y component plane corresponds to a single pixel in the U component plane and a single pixel in the V component plane.

Pixel processor 106 accesses captured bitmaps from memory device 112 via bus 108 and generates encoded image signals that represent one or more of the captured video images. Depending upon the particular encoding method implemented, as described in more detail below, pixel processor 106 applies a sequence of compression techniques to reduce the amount of data used to represent the information in each image. The encoded bitstream representative of the image may then be stored to memory device 112 via bus 108 for transmission to host processor 116 via bus 108, bus interface 110, and system bus 114 for storage in host memory 126.

Host processor 116 may transmit the encoded image to transmitter 118 for real-time transmission to a remote receiver (not shown in FIG. 1), store the encoded image to mass storage device 120 for future processing, or both. In addition, digital-to-analog converter 122 may receive and convert digital image signals to analog image signals for display in one or more windows on monitor 124. These image signals may correspond, for example, to raw captured video images or companded video images (i.e., the results of compressing and decompressing selected captured video images).

Figure 2:
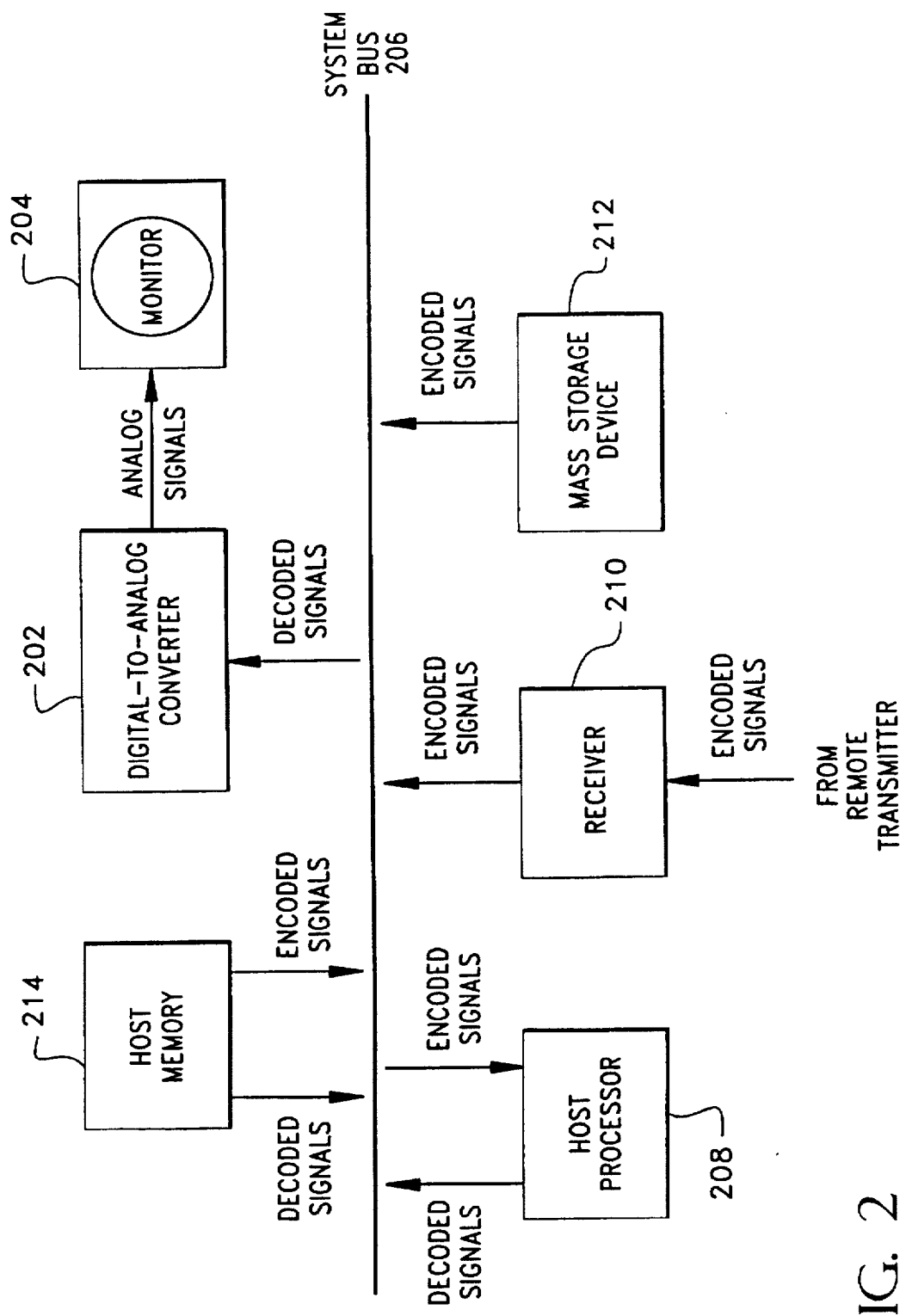
FIG. 2 is a computer-based decoding system for decoding the video signals encoded by the video processing system of FIG. 1, according to a preferred embodiment of the present invention.

Referring now to FIG. 2, there is shown a computer-based decoding system 200 for decoding the image signals encoded by encoding system 100 of FIG. 1, according to a preferred embodiment of the present invention. Host processor 208 of decoding system 200 receives encoded image signals via system bus 206 that were either stored in mass storage device 212 or received by receiver 210 from a remote transmitter, such as transmitter 118 of FIG. 1. The host processor 208 temporarily stores the encoded image signals in host memory 214.

Host processor 208 decodes the encoded image signals and scales the decoded image signals for display. Decoding the encoded image signals involves undoing the compression processing implemented by pixel processor 106 of encoding system 100 of FIG. 1. Scaling the decoded image signals involves upsampling the U and V component signals to generate full-sampled Y, U, and V component signals in which there is a one-to-one-to-one correspondence between Y, U, and V pixels in the scaled component planes. Scaling may also involve scaling the component signals to a display size and/or resolution different from the image signals as original captured. Host processor 208 then stores the scaled decoded image signals to host memory 214 for eventual transmission to digital-to-analog (D/A) converter 202 via system bus 206. D/A converter converts the digital scaled decoded image signals to analog image signals for display on monitor 204.

Referring again to FIG. 1, encoding system 100 is preferably a general microprocessor-based personal computer (PC) system with a special purpose video-processing plug-in board. In particular, A/D converter 102 may be any suitable means for decoding and digitizing analog video image signals. Capture processor 104 may be any suitable processor for capturing digitized video image component signals as subsampled frames. Pixel processor 106 may be any suitable means for encoding subsampled video image signals, where the means is capable of implementing a forward discrete cosine transform. Memory device 112 may be any suitable computer memory device and is preferably a video random access memory (VRAM) device. Bus 108 may be any suitable digital signal transfer device and is preferably an Industry Standard Architecture (ISA) bus or Extended ISA (EISA) bus. Bus interface 110 may be any suitable means for interfacing between bus 108 and system bus 114. In a preferred embodiment, A/D converter 102, capture processor 104, pixel processor 106, bus 108, bus interface 110, and memory device 112 are contained in a single plug-in board, such as an Intel® ActionMedia®-II board, capable of being added to a general microprocessor-based personal computer (PC) system.

Host processor 116 may be any suitable means for controlling the operations of the special-purpose video processing board and is preferably an Intel® general purpose microprocessor such as an Intel® 386, 486, or Pentium® processor. Host memory 126 may be any suitable memory device used in conjunction with host processor 116 and is preferably a combination of random access memory (RAM) and read-only memory (ROM). System bus 114 may be any suitable digital signal transfer device and is preferably an Industry Standard Architecture (ISA) bus or Extended ISA (EISA) bus. Mass storage device 120 may be any suitable means for storing digital signals and is preferably a computer hard drive. Transmitter 118 may be any suitable means for transmitting digital signals to a remote receiver and preferably transmits digital signals over PSTN lines. Those skilled in the art will understand that the encoded video signals may be transmitted using any suitable means of transmission such as telephone line (PSTN or ISDN), RF antenna, local area network, or remote area network.

D/A converter 122 may be any suitable device for converting digital image signals to analog image signals and is preferably implemented through a personal computer (PC)-based display system such as a VGA or SVGA system. Monitor 204 may be any means for displaying analog image signals and is preferably a VGA monitor.

Referring now to FIG. 2, decoding system 200 is preferably a general microprocessor-based personal computer (PC) system similar to the basic PC system of encoding system 100. In particular, host processor 208 may be any suitable means for decoding and scaling encoded image signals and is preferably an Intel® general purpose microprocessor such as an Intel® 386, 486, or Pentium® processor. Host memory 214 may be any suitable memory device used in conjunction with host processor 116 and is preferably a combination of random access memory (RAM) and read-only memory (ROM). In an alternative preferred embodiment, decoding system 200 may also have a pixel processor similar to pixel processor 106 of FIG. 1 for decoding the encoded image signals and a display processor such as an Intel® i750® Display Processor for scaling the decoded image signals.

System bus 206 may be any suitable digital signal transfer device and is preferably an Industry Standard Architecture (ISA) bus or Extended ISA (EISA) bus. Mass storage device 212 may be any suitable means for storing digital signals and is preferably a CD-ROM device. Receiver 210 may be any suitable means for receiving the digital signals transmitted by transmitter 118 of encoding system 100. D/A converter 202 may be any suitable device for converting digital image signals to analog image signals and is preferably implemented through a personal computer (PC)-based display system such as a VGA or SVGA system. Monitor 204 may be any means for displaying analog image signals and is preferably a VGA monitor.

In a preferred embodiment, encoding system 100 of FIG. 1 and decoding system 200 of FIG. 2 are two distinct computer systems. In an alternative preferred embodiment of the present invention, a single computer system comprising all of the different components of systems 100 and 200 may be used to encode and decode video image signals. Those skilled in the art will understand that such a combined system may be used to display decoded video image signals in real time during the capture and encoding of video signals to monitor the encoding processing.

In a preferred embodiment encoding system 100 encodes video image signals in real time to yield an encoded bitstream containing code words, and transmits the encoded bitstream to decoding system 200. As will be appreciated by those skilled in the art, encoding system may also be configured to encode other types of data, such as symbols representing characters or numbers. Encoding system 100 is configured to implement the encoding method of the current invention, and decoding system 200 is configured to implement the decoding method of the present invention, as described in further detail hereinbelow.

VLC Encoding and Decoding

Figure 3:
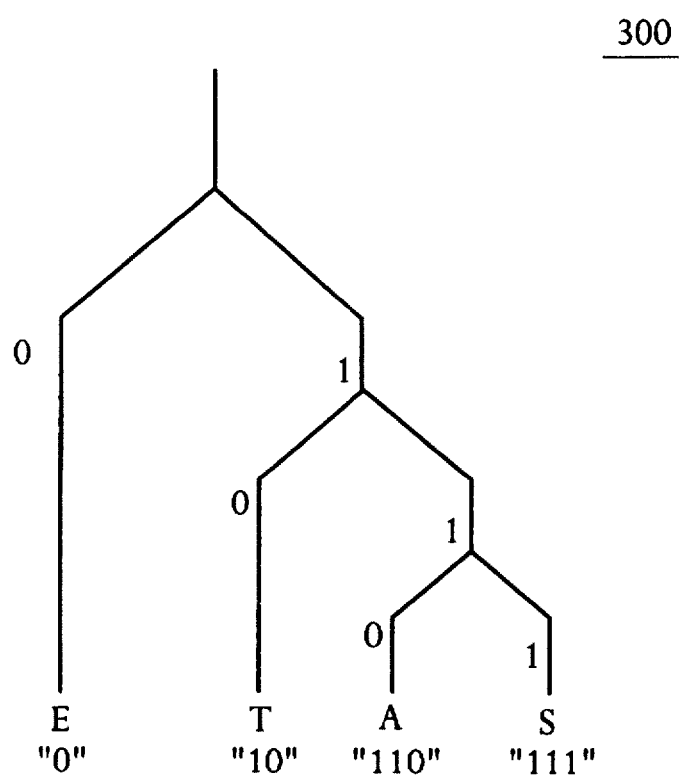
FIG. 3 is an exemplary Huffman tree, according to a preferred embodiment of the present invention.

Referring now to FIG. 3, there is shown an exemplary Huffman tree 300, according to a preferred embodiment of the present invention. In the present invention, it is recognized that certain symbols of S may be relatively more or less dominant for current messages than for the original training message which was used to derive Huffman tree 300. As an example, it is assumed that a symbol set S={E, T, A, S}, along with a training message MT comprised of symbols from S, is used to generate the Huffman tree 300 to be used to encode and decode messages comprising symbols of S. For instance, to encode messages in English, a training message in English consisting of words in a representative newspaper editorial may be used to determine the relative frequency, and thus probability, of different letters of the alphabet. More common letters such as "E" may occur more frequently than letters such as "Z", for instance.

As will be appreciated by those skilled in the art, in S, $E=S_0$, $T=S_1$, $A=S_2$, and $S=S_3$, which correspond to probabilities $p_{T0}$ to $p_{T3}$, where $p_{Ti}$ represents the probability of occurrence of symbol $S_i$ of S in message $M_T$. As will be understood, these probabilities are ordered in monotonically decreasing fashion so that, for example, $S_0$ is the most probable symbol of S and $S_3$ is the least probable symbol of S, within training message $M_T$. It will be understood that the subscript "T" denotes probabilities associated with the training message $M_T$. In the current example, the letters E, T, A, S may represent probable letters of the English alphabet. In more detailed implementations, a symbol set could include all the letters of the alphabet, arranged in monotonically decreasing fashion. It will be understood that the symbols E, T, A, and S might have a different distribution for different messages, for example messages in a language other than English which use these symbols with different frequencies.

As illustrated in Huffman table 300 of FIG. 3, because E is the most probable symbol, it is encoded with the smallest number of bits, and corresponds to the code word "0". Similarly, T corresponds to code word "10", A corresponds to code word "110", and S corresponds to code word "111". In this manner, each time the most common symbol E is transmitted, it requires only 1 bit to encode and transmit, excluding overhead.

Figure 4:
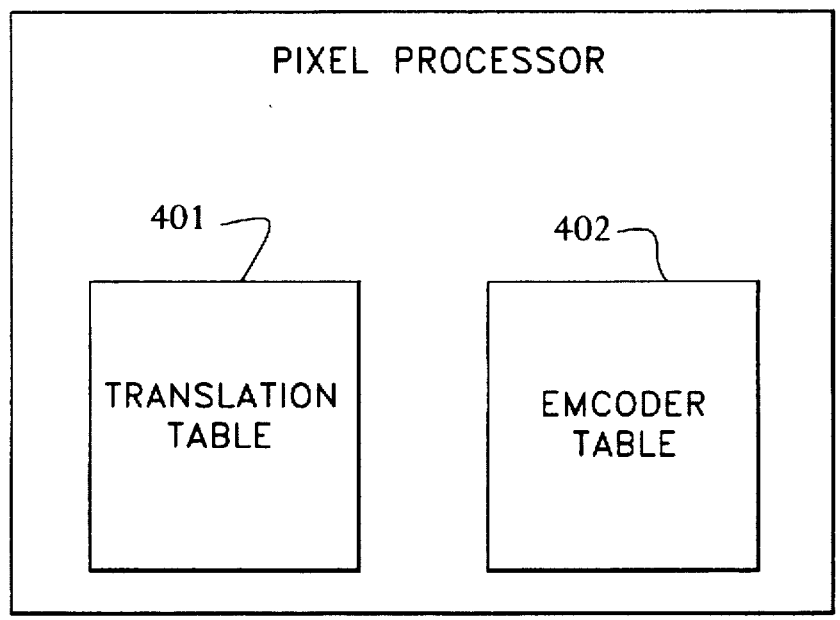
FIG. 4 is a translation table and an encoder table for use with the pixel processor of the encoding system of FIG. 1.

As will be understood by those skilled in the art, Huffman tree 300 is stored in memory in, for example, tabular form within both encoding system 100 and decoding system 200. Referring now to FIG. 4, there is shown a translation table 401 and an encoder table 402 for use with pixel processor 106 of encoding system 100 of FIG. 1. As will be understood, encoder table 402 may be a ROM table within pixel processor 106, and translation table 401 may be stored in RAM within pixel processor 106. It will be appreciated that tables 401, 402 may be stored within other memory devices within encoding system 100 in alternative preferred embodiments of the present invention. It will also be appreciated that the processing functions described herein may be performed by processors other than pixel processor 106 of encoding system 100 and host processor 208 of decoding system 200, such as the Intel® i750® Display Processor.

As will be understood by those skilled in the art, when the structure of Huffman tree 300 is to be stored in usable form within encoding system 100 so that pixel processor 106 may encode symbols into the appropriate code words, the structure and contents of translation table 401 and encoder table 402 may be as indicated in Tables 1 and 2 below:

TABLE 1

Translation Table 401

| Symbol | Order Number |
|---|---|
| E | 0 |
| T | 1 |
| A | 2 |
| S | 3 |

TABLE 2

Encoder Table 402

| Order No. | Code Word | Count |
|---|---|---|
| 0 | 0 | 1 |
| 1 | 10 | 2 |
| 2 | 110 | 3 |
| 3 | 111 | 3 |

TABLE 3

Form of Tree Table 501 Entry

| 0-link | 0-value | 1-link | 1-value |
|---|---|---|---|
| next link or illegal value | value | next link or illegal value | value |

TABLE 4

Index Table 502

| Value | Symbol |
|---|---|
| 0 | E |
| 1 | T |
| 2 | A |
| 3 | S |

As shown in Table 1, each symbol $S_i$ of symbol set S is assigned an order number corresponding to its index when S is ordered in monotonically decreasing fashion for a given message. Thus, for example, because E is the most common, it is first, and has an order number of "0", whereas S, the least common or probable symbol of S, has an order number of 3.

Table 2 correlates an order number with its respective code word and the "count," which represents the length, in bits, of the code word. If, for example, the letter T is to be encoded into a code word, it will be applied to translation table 401, which will output an order number of 1 to encoder table 402. This will yield a count of 2, and a pointer which will point to the beginning of code word 10. Those skilled in the art will appreciate that pixel processor 106 does not know a priori the number of code word bits needed to represent a given symbol, and therefore count allows pixel processor to start at the beginning of the code word and read off a number of bits equal to the count.

In systems which are designed to perform byte operations rather than operate on a bit basis, the entire byte(s) containing the code word may be read at once and the count value used to filter out the unneeded bits. For instance, a count of 2 can indicate that the two least significant bits of an indicated byte are the code word for the current symbol.

Those skilled in the art will appreciate that encoder table 402 may, in alternative preferred embodiments, be utilized without a separate translation table 401, if the symbol itself rather than its order number is represented in encoder table 402.

Figure 5:
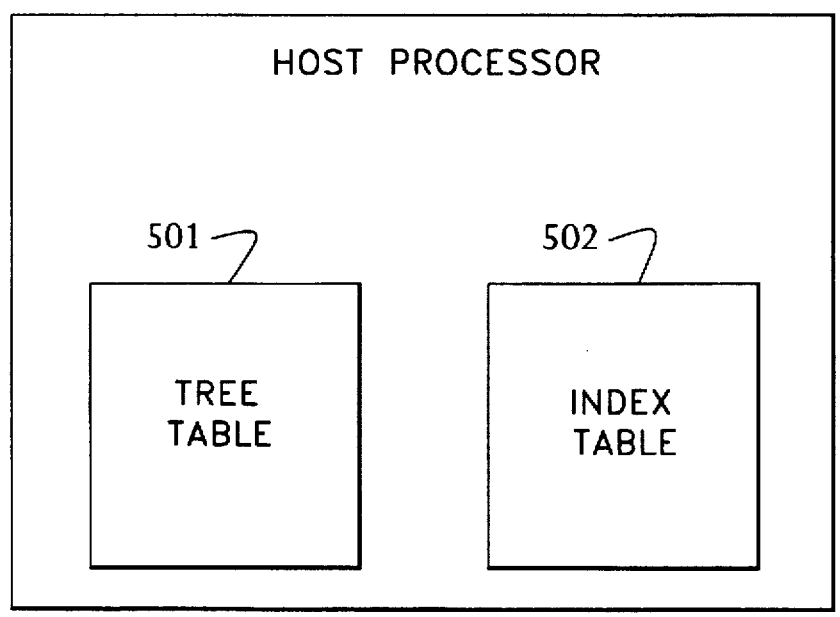
FIG. 5 is a tree table and index table for use with the host processor of the decoding system of FIG. 2.

Referring now to FIG. 5, there is shown a tree table 501 and index table 502 for use with host processor 208 of decoding system 200 of FIG. 2. As will be understood, tree table 501 is a decoder table that may be a RAM table within host processor 208, and index table 501 may be stored in RAM within host processor 106. It will be appreciated that tables 501, 502 may be stored within other memory devices such as ROM within encoding system 200 in alternative preferred embodiments of the present invention.

As will be understood by those skilled in the art, when the structure of Huffman tree 300 is to be stored in usable form within encoding system 200 so that host processor 208 may decode received code words into the appropriate symbols, the structure and contents of tree table 501 and index table 502 may be as indicated in Tables 3 and 4 below:

As illustrated in Table 3, tree table 501 contains many entries corresponding to different nodes of Huffman tree 300 and, as illustrated, is a linked list. Each time a bit is received from encoding system 100, it is applied to tree table 501 to move down Huffman tree 300 until a value is produced when a leaf is reached. Four possible fields are associated with each entry in tree table 501, for the two possible values of the current bit. If the current bit is a 0, then a 0-link value indicates the next entry in tree table 501 to go to. If an illegal value is located in the 0-link field, this indicates that no further jumps are to be made, and the value present in the 0-value field is output. Similar accesses are made when a 1 is present in the bit field of the current entry of tree table 501.

In a preferred embodiment, the value output after a leaf is reached in tree table 501 is a number which may be applied to index table 502 to retrieve the appropriate symbol. As shown in Table 4, the output value may correspond to the order number of symbols of set S. As will be understood by those skilled in the art, in alternative preferred embodiments the 0-value or 1-value may output the symbol itself rather than the order number which is used with an index table.

As will be further understood by those skilled in the art, all or portions of the nodes of Huffman tree 300 may be represented by a lookup table rather than using a linked list which traces through the tree structure for each bit sequence received. Thus, where a lookup table is used instead, a byte applied to the lookup table may yield an output of three symbols represented by the code words in the byte, with possibly some bits remaining that are portions of an incomplete code word to be completed in subsequent bytes.

Reordering Symbols

Current message $M_C$ may refer to any number of sequences of data that may be currently transmitted. For example, $M_C$ can refer to symbols representing a current video frame, or sequence of video frames, or a sequence of any desired length of characters of textual information. A new message $M_C$ can be defined to distinguish from previous messages or from training message $M_T$ to whenever the symbol statistics of data being encoded change significantly from those of training message $M_T$ so that it is worthwhile to apply the method of the current invention to improve the encoding efficiency. For example, in image processing, whenever a scene cut is detected, encoding system 100 may determine whether symbol set S is still monotonically decreasing. As another example, if a Huffman tree was created based on an English message $M_T$ and text is now being transmitted that is derived from another language, it is likely that the statistics of S in the current data may be different from those of S in $M_T$.

Thus, when a current message $M_C$ is to be encoded and decoded using Huffman tree 300, it is possible that the probabilities $p_{C0}$ to $P_{C3}$ are different than $p_{T0}$ to $p_{T3}$, and that symbols $S_0$ to $S_3$ may no longer be monotonically decreasing. Thus, for example, symbol E may currently be associated with probability $p_{C0}$ which is different than probability $p_{T0}$, although E may still be dominant in both messages. It will be understood that the subscript "C" denotes symbols or probabilities associated with the current message $M_C$. As will be also understood, a symbol $S_i$ of S is associated with probability $p_{Ti}$ for training message $M_T$ and with probability $p_{Ci}$ for current message $M_C$.

However, for current message $M_C$, some symbols may occupy a different order. For example, message $M_C$ may comprise a message in a language other than English, in which A is the most common symbol and E is the third-most common symbol. Thus, in this case, $E=S_0$, $T=S_1$, $A=S_2$, and $S=S_3$, as defined above, which correspond to probabilities $p_{C0}$ to $p_{C3}$, where $p_{Ci}$ represents the probability of occurrence of symbol $S_i$ of S in message $M_C$, but probabilities $p_{C0}$ to $p_{C3}$ are non-monotonically decreasing. Furthermore, even though A is most common now and E was most common previously, their respective probabilities $p_{T0}$ and $p_{C2}$ are not necessarily the same, i.e. A might not appear exactly as often in current message $M_C$ as does E in training message $M_T$, even though both are the most dominant symbol. As a numerical example for purposes of illustration, $P_{T0}$=0.40; $P_{T1}$=0.30; $P_{T2}$=0.20; $P_{T3}$=0.10; and
$P_{C0}$=0.21; $P_{C1}$=0.30; $P_{C2}$=0.39; $P_{C3}$=0.10.

Huffman tree 300 is used to encode current message $M_C$, therefore, there will be a mismatch in encoding symbols E and A, since $P_{C0}$ to $P_{C3}$ are no longer monotonically decreasing. Those skilled in the art will realize that in this case symbol A should be encoded with "0" since it is now most probable, and therefore should use the smallest code word. However, A will instead be encoded with code word "110", using three bits instead of one.

Ideally, a new Huffman tree would remove this mismatch and improve the VLC encoding efficiency. The entire structure of a new Huffman tree might be different as well, for larger symbol sets, when the probabilities of the symbols are different. But because either or both of encoder table 402 and tree table 501 may be hard coded in ROM in encoding system 100 and decoding system 200, respectively, as explained above, it is impracticable to provide a new Huffman tree that efficiently encodes the current message $M_C$. Furthermore, even if encoder table 402 and tree table 501 are stored in RAM which may be changed, it may be impractical or inefficient to change the tree structure as stored in these tables because, for example, the overhead of transmitting a new tree to decoding system 200 may be prohibitive.

Therefore, in the present invention the existing Huffman tree is utilized in a more efficient manner by changing the order of certain symbols of the Huffman tree 300. Where translation table 401 and index table 502 are stored in RAM and used in conjunction with encoder table 402 and tree table 501, the symbol ordering in translation table 401 and index table 502 may be reordered to more efficiently use the existing Huffman tree structure. Where either encoder table 402 is stored in RAM and used without translation table 401, or tree table 501 is stored in RAM and used without index table 502, as described above with reference to FIGS. 3 and 4, the symbol ordering in encoder table 402 and in tree table 501 may be changed directly without affecting the existing Huffman tree structure. Techniques for such reordering in accordance with the present invention will be described in further detail hereinbelow.

In the example provided above, where E and A are mismatched, their order may be swapped as follows. Pixel processor 106 changes the entries in translation table 401 as illustrated in Table 1', below:

TABLE 1'

| Modified Translation Table 401 | | |
|---|---|---|
| Symbol | Old Order Number | New Order Number |
| E | 0 | 2 |
| T | 1 | 1 |
| A | 3 | 0 |
| S | 2 | 3 |

Thus, each time A is to be encoded, it will be associated with order number 0 (reflecting the fact that it is, in $M_C$, now the most dominant symbol), which will be encoded via encoder table 402 as "0" rather than "110". As will be appreciated by those skilled in the art, the structure of Huffman tree 300 as reflected in encoder table 402, is unchanged, but some of the nodes are effectively relabeled by this reordering of symbol orders.

As will be understood by those skilled in the art, Huffman tree 300 nodes may be relabeled in this fashion, in alternative preferred embodiments, by directly changing encoder table 402. For example, where encoder table 402 is utilized without a separate translation table 401, encoder table 402 outputs a code word when supplied with a symbol itself rather than its order number. In this case, the symbol ordering used to index encoder table 402 may be changed as described to achieve the same results.

To ensure decoding 200 system properly decodes the re-ordered symbol code words received, corresponding changes must be made to the Huffman tree representations in decoding system 200. To reorder symbols, e.g. to swap E and A, various approaches may be utilized. In a preferred embodiment, a message is transmitted from encoding system 100 to decoding system 200 to "swap E and A", which may be done by making the following changes in index table 502, as illustrated in Table 4', below:

TABLE 4'

| Modified Index Table 502 | | |
|---|---|---|
| Value | Old Symbol | New Symbol |
| 0 | E | A |
| 1 | T | T |
| 2 | A | E |
| 3 | S | S |

Thus, whenever encoding system 100 encodes E, it will output a code word "110", which used to represent A. When the code word "110" is applied to tree table 501, the order number 2 is output, just as would have occurred before any reordering. However, when order number 2 is applied to modified index table 502, rather than outputting symbol A, symbol E will be output. Thus, some of the nodes of Huffman tree 300 are relabeled in decoding system 200 without affecting Huffman tree 300 itself, which it is assumed may not be modified because it is hard coded or because of overhead inefficiencies as described hereinabove. In this manner, as will be appreciated by those skilled in the art, the order of symbols may be changed in both the decoder and encoder without affecting the basic Huffman tree structure, while realizing gains in efficiency by encoding more dominant symbols of the current message with smaller code words.

In alternative preferred embodiments, where tree table 501 is stored in RAM and used without index table 502, the 0-value or 1-value of tree table 501 may output the symbol itself rather than the order number which is used with an index table, as described above with reference to FIG. 4. In this case, as will be understood by those skilled in the art, the symbol values output directly by tree table 501 may be reordered as described above. For example, there will be four entries within tree table 501 that output symbol-values rather than indices, corresponding to the four possible symbols, E, T, A, and S. Because E is reached in Huffman tree after a "0" bit, there will be an entry in tree table 501 where a 0 in the bit field corresponds to an illegal value in the 0-link field, and the 0-value field contains E. Similarly, code word "110" (which ends with "0") produces A in Huffman tree 300, thus there will also be an entry in tree table 501 where a 0 in the bit field corresponds to an illegal value in the 0-link field, and the 0-value field contains A. To swap E and A, therefore, these two 0-value fields should be swapped.

In a more generalized case, in a preferred embodiment pixel processor 106 examines the probability distribution $P_{C0}$ to $P_{Cn-1}$ of the symbol set $S=\{S_0, \ldots S_{n-1}\}$, for a current message $M_C$, where n is the number of symbols in symbol set S of which message $M_C$ is comprised. Pixel processor 106 determines whether any reordering may be made to translation table 401 and index table 502 so that the most dominant symbols are associated with the smallest code words, to more efficiently encode current message $M_C$.

In one preferred heuristic, pairs of symbols $S_i$ and $S_j$ of S are switched in the manner described above in order to preserve a rough amount of decreasing order in the probability of the reordered set S. As will be understood by those skilled in the art, $(i-j)$ $(p_{Ci}-p_{Cj}) \leq 0$ for all i,j pairs if symbol set S of message $M_C$ is in monotonically decreasing order. Thus, whenever this expression is positive, the order of symbols $S_i$ and $S_j$ may be switched to reduce the mismatch between these two symbols. Using the numerical examples provided above, where n=3, for i=0 and j=2, (0−2)(0.21−0.39)=0.4, which is greater than zero. However, some overhead is required to transmit and implement this switching information. Thus, in a preferred embodiment, $S_i$ and $S_j$ are switched only when $(i-j)$ $(p_{Ci}-p_{Cj})$ is positive and large, i.e. above a predetermined threshold. If $(i-j)$ $(p_{C1}-p_{C2})$ is positive but below the threshold, this may indicate that both symbols $S_i$ and $S_j$ are very rare even though their order is wrong, and that little gain will be had from changing the order in which Huffman tree 300 encodes and decodes them. Alternatively, a positive value below the threshold may also result if $S_i$ and $S_j$ are both relatively probable, where their respective probabilities are very close to one another. If there is little difference between $P_{Ci}$ and $P_{Cj}$, then even if $S_i$ and $S_j$ are out of order, very little gain will be had from swapping these symbols' order.

Therefore, in a preferred embodiment, a number of passes P is made through S, and the order of symbols $S_i$ and $S_j$ is swapped if and only if $(i-j)$ $(p_{Ci}-p_{Cj})>K$, where K is a positive threshold. For example, K may in some embodiments be experimentally determined to be approximately ½. As will be understood, a number of passes may be made, applying this heuristic, to incrementally improve the results each time. Alternatively, S may be iteratively reordered until no $S_i$, $S_j$ pairs satisfy the inequality above. Once a satisfactory number of symbols have been switched so that more dominant symbols are moved to the front of symbol set S, so that smaller code words now represent them, these symbols are reordered in translation table 401 as described above. Information is also transmitted to decoding system 200, where the corresponding changes are made in index table 502, as described above.

Figure 6:
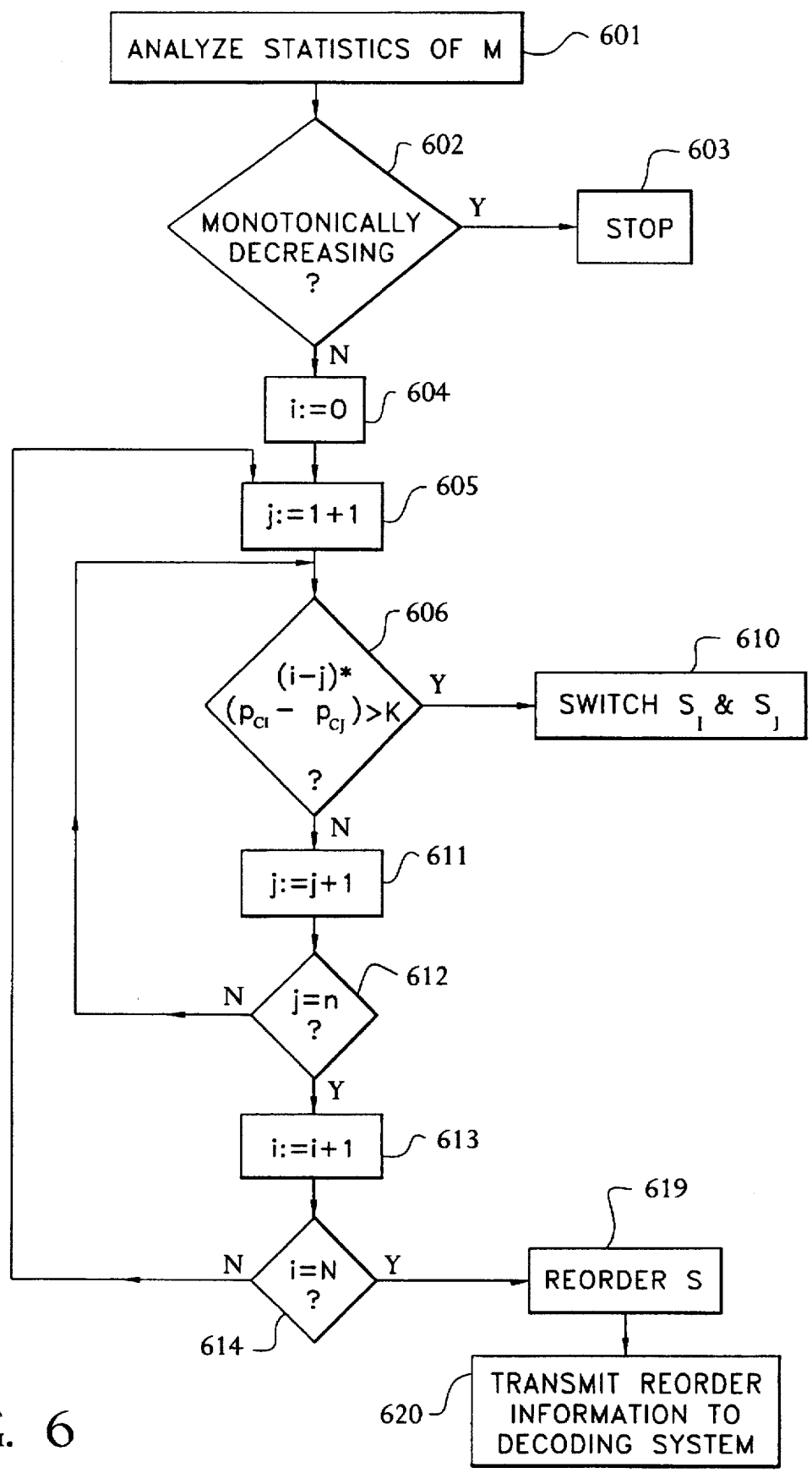
FIG. 6 is a flow chart of the method of operation of the present invention.

This method of operation of the present invention will now be described with reference to the flow chart of FIG. 6. Whenever encoding system determines that the current messages being encoded or to be encoded might possibly have different statistics than those of the training message $M_T$, pixel processor 106 analyzes the statistics of current message $M_C$ (step 601 of FIG. 6). If the entire set is monotonically decreasing, then no reordering is performed (steps 602, 603). If, however, S is not monotonically decreasing (step 602), then the inequality comparison (step 606) is made for all symbol pairs $S_i$, $S_j$ to see if $S_i$ and $S_j$ should be swapped. After a full pass is made (steps 604–614), S is reordered accordingly in encoding system by reordering translation table 401 as described above (step 619), and information is transmitted to decoding system 200 to instruct it to correspondingly reorder index table 502 as described above (step 620).

As explained above, only one full pass (steps 604–614) may be made, or a predetermined maximum number of passes, in alternative preferred embodiments. Additionally, the pass (steps 604–614) and comparison (step 606) can be limited in alternative preferred embodiments to comparing the 10% most dominant symbols with the first 10% symbols as currently ordered.

In an alternative preferred embodiment, a heuristic is used in which the most dominant symbols of S which are out of order are inserted properly in order in set S, rather than merely swapped with other symbols. As will be understood, insertion can require the reordering of many symbols following the new location of the re-ordered symbol, which may be expensive in terms of overhead. For example, for any symbols $S_i$ and $S_{i+1}$ for which $P_{Ci}<P_{Ci+1}$, symbol $S_{i+1}$ is out of order, and should be ordered to appear earlier in set S to achieve a monotonically decreasing set S for current message $M_C$. In a preferred embodiment, symbol $S_{i+1}$ is reordered only if it is among the 100 most dominant symbols of S. If so, it may be inserted between $S_k$ and $S_{k+1}$, where $p_{Ck} \geq P_{Ci+1} \geq P_{Ck+1}$. When this is done symbols $S_{k+1}$, $S_{k+2}, \ldots S_i$ must be reordered by mapping them to positions $S_{k+2}, S_{k+3}, \ldots S_{i+1}$, respectively, as will be understood by those skilled in the art.

This insertion heuristic may be performed for the entire set S so that S in current message $M_C$ is now monotonically decreasing, or it may be performed only until the first 10% most dominant symbols of S are monotonically decreasing. It will be understood by those skilled in the art that thresholds other than 10% may be selected depending upon trial and error results to produce the best increase in efficiency while taking overhead into account.

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. A computer-implemented method for encoding symbols of a current message with a variable-length code generated based on the statistics of a previous message, the method comprising the steps of:

(a) analyzing the statistics of the current message, wherein the symbols of the current message constitute a symbol set;

(b) determining whether
   $(i-j)*(p_i-p_j)>K$ for any i,j pair, wherein:
   K is a predetermined positive threshold;
   $p_i$ is the probability of symbol $S_i$ of the symbol set in the current message;
   the symbol set contains n symbols; and
   $0 \leq i,j \leq n-1$; and (c) swapping $S_i$ and $S_j$ in accordance with step (b) to update the order of the symbol set.

2. The method of claim 1, comprising the further step of:
(d) encoding symbols of the current message using the variable-length code.

3. The method of claim 1, further comprising the step of:
(d) repeating steps (b) and (c) until $(i-j)*(p_i-p_j)$ is not greater than K for any i,j pair.

4. The method of claim 1, further comprising the steps of:
(d) reordering symbols of the symbol set in a translation table of an encoder system in accordance with the swapping of step (c); and
(e) transmitting an instruction to a decoder system to instruct the decoder system to reorder symbols of the symbol set in an index table of the decoder system in accordance with the swapping of step (c).

5. The method of claim 1, further comprising the steps of:
(d) reordering symbols of the symbol set in an encoder table of an encoder system in accordance with the swapping of step (c); and
(e) transmitting an instruction to a decoder system to instruct the decoder system to reorder symbols of the symbol set in a decoder table of the decoder system in accordance with the swapping of step (c).

6. The method of claim 1, wherein K is ½.

7. The method of claim 1, wherein steps (b) and (c) are restricted to operation on a symbol subset of the symbol set, wherein the sum of the probabilities of the symbols of the symbol subset in the current message are above a predetermined probability threshold.

8. The method of claim 7, wherein the predetermined probability threshold is 10%.

9. An apparatus for encoding symbols of a current message with a variable-length code generated based on the statistics of a previous message, the apparatus comprising:
(a) means for analyzing the statistics of the current message, wherein the symbols of the current message constitute a symbol set;
(b) means for determining whether $(i-j)*(p_i-p_j)>K$ for any i,j pair, wherein:
   K is a predetermined positive threshold;
   $p_i$ is the probability of symbol $S_i$ of the symbol set in the current message;
   the symbol set contains n symbols; and
   $0 \leq i,j \leq n-1$; and
(c) means for swapping $S_i$ and $S_j$ in accordance with step (b to update the order of the symbol set.

10. The apparatus of claim 9, further comprising:
(d) means for encoding symbols of the current message using the variable-length code.

11. The apparatus of claim 9, further comprising:
(d) means for repeating the determining and swapping of means (b) and (c) until $(i-j)*(p_i-p_j)$ is not greater than K for any i,j pair.

12. The apparatus of claim 9 further comprising:
(d) a translation table of an encoder system;
(e) means for reordering symbols of the symbol set in the translation table in accordance with the swapping of means (c); and
(f) means for transmitting an instruction to a decoder system to instruct the decoder system to reorder symbols of the symbol set in an index table of the decoder system in accordance with the swapping of means (c).

13. The apparatus of claim 12, wherein the apparatus is electrically connected to a bus and the bus is electrically connected to a memory device.

14. The apparatus of claim 9 further comprising:
(d) an encoder table of an encoder system;
(e) means for reordering symbols of the symbol set in the encoder table in accordance with the swapping of means (c); and
(f) means for transmitting an instruction to a decoder system to instruct the decoder system to reorder symbols of the symbol set in a decoder table of the decoder system in accordance with the swapping of means (c).

15. The apparatus of claim 9, wherein the apparatus is electrically connected to a bus and the bus is electrically connected to a memory device.

16. The apparatus of claim 9, wherein K is ½.

17. The apparatus of claim 9, wherein means (b) and (c) are restricted to operation on a symbol subset of the symbol set, wherein the sum of the probabilities of the symbols of the symbol subset in the current message are above a predetermined probability threshold.

18. The apparatus of claim 17, wherein the predetermined probability threshold is 10%.

19. A computer-readable medium having stored thereon a plurality of instructions, wherein the plurality of instructions are for encoding symbols of a current message with a variable-length code generated based on the statistics of a previous message, wherein the plurality of instructions, when executed by a processor of a computer system, cause the processor to perform the steps of:
(a) analyzing the statistics of the current message, wherein symbols of the current message constitute a symbol set;
(b) determining whether $(i-j)*(p_i-p_j)>K$ for any i,j pair, wherein:
   K is a predetermined positive threshold;
   $p_i$ is the probability of symbol $S_i$ of the symbol set in the current message;
   the symbol set contains n symbols; and
   $0 \leq i,j \leq n-1$; and
(c) swapping $S_i$ and $S_j$ in accordance with step (b) to update the order of the symbol set.

20. The computer-readable medium of claim 19, wherein the plurality of instructions further cause the processor to perform the step of:
(d) encoding symbols of the current message using the variable-length code.

21. The computer-readable medium of claim 19, wherein the plurality of instructions further cause the processor to perform the step of:
(d) repeating steps (b) and (c) until $(i-j)*(p_i-p_j)$ is not greater than K for any i,j pair.

22. The computer-readable medium of claim 19, wherein the plurality of instructions further cause the processor to perform the steps of:
(d) reordering symbols of the symbol set in a translation table of an encoder system in accordance with the swapping of step (c); and
(e) transmitting an instruction to a decoder system to instruct the decoder system to reorder symbols of the symbol set in an index table of the decoder system in accordance with the swapping of step (c).

23. The computer-readable medium of claim 19, wherein the plurality of instructions further cause the processor to perform the steps of:
   (d) reordering symbols of the symbol set in an encoder table of an encoder system in accordance with the swapping of step (c); and
   (e) transmitting an instruction to a decoder system to instruct the decoder system to reorder symbols of the symbol set in a decoder table of the decoder system in accordance with the swapping of step (c).

24. The computer-readable medium of claim 19, wherein K is ½.

25. The computer-readable medium of claim 19, wherein steps (b) and (c) are restricted to operation on a symbol subset of the symbol set, wherein the sum of the probabilities of the symbols of the symbol subset in the current message are above a predetermined probability threshold.

26. The computer-readable medium of claim 25, wherein the predetermined probability threshold is 10%.

* * * * *